US007307866B2

(12) United States Patent
Yamaoka et al.

(10) Patent No.: US 7,307,866 B2
(45) Date of Patent: Dec. 11, 2007

(54) FERROELECTRIC MEMORY AND METHOD FOR READING DATA FROM THE FERROELECTRIC MEMORY

(75) Inventors: Kunisato Yamaoka, Osaka (JP); Hiroshige Hirano, Nara (JP); Yasushi Gohou, Osaka (JP); Shunichi Iwanari, Kyoto (JP); Yasuo Murakuki, Kyoto (JP); Masahiko Sakagami, Kyoto (JP); Tetsuji Nakakuma, Shiga (JP); Takashi Miki, Hyogo (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 61 days.

(21) Appl. No.: 11/132,196

(22) Filed: May 19, 2005

(65) Prior Publication Data

US 2005/0259461 A1 Nov. 24, 2005

(30) Foreign Application Priority Data

May 21, 2004 (JP) ............................. 2004-151576

(51) Int. Cl.
*G11C 11/22* (2006.01)
*G11C 11/42* (2006.01)
*G11C 5/14* (2006.01)
*G11C 7/00* (2006.01)
*G11C 7/02* (2006.01)

(52) U.S. Cl. .................... 365/145; 365/65; 365/189.09; 365/203; 365/207

(58) Field of Classification Search ................ 365/145, 365/203

See application file for complete search history.

(56) References Cited

U.S. PATENT DOCUMENTS

| 6,229,744 | B1 * | 5/2001 | Hsiao et al. ................. 365/203 |
| 6,252,793 | B1 | 6/2001 | Allen et al. |
| 6,840,410 | B2 | 1/2005 | Dark |
| 2002/0024840 | A1 * | 2/2002 | Noro et al. .................. 365/145 |
| 2003/0137866 | A1 * | 7/2003 | Nishihara .................... 365/145 |
| 2004/0017704 | A1 | 1/2004 | Yamaoka et al. |
| 2004/0245547 | A1 * | 12/2004 | Stipe ........................... 257/200 |
| 2005/0174832 | A1 * | 8/2005 | Nishihara .................... 365/145 |
| 2005/0259461 | A1 * | 11/2005 | Yamaoka et al. ........... 365/145 |

OTHER PUBLICATIONS

Y. Chung et al., "A 3.3-V 4-Mb Nonvolatile Ferroelectric RAM with a Selectively-Driven Double-Pulsed Plate Read/Write-Back Scheme", Symposium on VLSI Circuits Digest, Jun. 1999, pp. 97-98.

* cited by examiner

*Primary Examiner*—Lý Duy Pham
(74) *Attorney, Agent, or Firm*—McDermott Will & Emery LLP

(57) ABSTRACT

A ferroelectric memory of the present invention comprises: a plurality of normal cells, each of which includes a first ferroelectric capacitor for holding data and a first transistor connected to a first electrode of the first ferroelectric capacitor; a first bit line connected to the first transistor; a first bit line precharge circuit which is a switch circuit provided between the first bit line and a ground; and a word line connected to a gate of the first transistor. The word line is deactivated to disconnect the first ferroelectric capacitor from the first bit line before the first bit line precharge circuit is driven to discharge a potential of the first bit line.

1 Claim, 8 Drawing Sheets

FERROELECTRIC MEMORY AND METHOD FOR READING DATA FROM THE FERROELECTRIC MEMORY

CROSS-REFERENCE TO RELATED APPLICATION

This application claims priority under 35 U.S.C. § 119(a) on Japanese Patent Application No. 2004-151576 filed on May 21, 2004, the entire contents of the specification, drawings and claims of which are hereby incorporated by reference.

BACKGROUND OF THE INVENTION

The present invention relates to a ferroelectric memory wherein a ferroelectric capacitor is used for a memory cell and to a method for reading data from the ferroelectric memory.

In recent years, with the progress of process miniaturization and increase in capacity, a larger number of ferroelectric memories have employed a memory cell formed by one transistor and one ferroelectric capacitor, which has a reduced memory cell size, in substitution for an existing memory cell formed by two transistors and two ferroelectric capacitors. A ferroelectric memory employing the memory cell formed by one transistor and one ferroelectric capacitor requires a reference cell for generating a reference potential (reference level) in addition to a normal cell for holding data, i.e., memory cell. Thus, preventing deterioration of data which can be caused due to a decrease in the amount of polarized charges held in a ferroelectric capacitor of a memory cell, or the like, and shortening the bit line discharge time of the memory cell have been more important for improving the reliability and operation speed of the ferroelectric memory.

Hereinafter, a conventional ferroelectric memory is described with reference to the drawings (see, for example, Y. Chung et al., "A 3.3-V 4-Mb Nonvolatile Ferroelectric RAM with a Selectively-Driven Double-Pulsed Plate Read/Write-Back Scheme", Symposium on VLSI Circuits Digest, June 1999, pp. 97-98).

FIG. 5 shows a circuit structure of a conventional ferroelectric memory. As shown in FIG. 5, the conventional ferroelectric memory includes a first normal cell 101 and a second normal cell 102 as memory cells for storing data. The first normal cell 101 is formed by a first transistor T1 and a first ferroelectric capacitor C1. The gate of the first transistor T1 is connected to a word line WL, and the drain of the first transistor T1 is connected to a first bit line BL1. The first electrode of the first ferroelectric capacitor C1 is connected to the source of the first transistor T1, and the second electrode of the first ferroelectric capacitor C1 is connected to a cell plate line CP. The second normal cell 102 is formed by a third transistor T3 and a third ferroelectric capacitor C3. The gate of the third transistor T3 is connected to the word line WL, and the drain of the third transistor T3 is connected to a third bit line BL3. The first electrode of the third ferroelectric capacitor C3 is connected to the source of the third transistor T3, and the second electrode of the third ferroelectric capacitor C3 is connected to the cell plate line CP.

The conventional ferroelectric memory of FIG. 5 includes a first reference cell 103 and a second reference cell 104 as memory cells for storing data used for generation of a reference potential. The first reference cell 103 is formed by a second transistor T2 and a second ferroelectric capacitor C2. The gate of the second transistor T2 is connected to a reference word line RWL, and the drain of the second transistor T2 is connected to a second bit line BL2. The first electrode of the second ferroelectric capacitor C2 is connected to the source of the second transistor T2, and the second electrode of the second ferroelectric capacitor C2 is connected to a reference cell plate line RCP. The second reference cell 104 is formed by a fourth transistor T4 and a fourth ferroelectric capacitor C4. The gate of the fourth transistor T4 is connected to the reference word line RWL, and the drain of the fourth transistor T4 is connected to a fourth bit line BL4. The first electrode of the fourth ferroelectric capacitor C4 is connected to the source of the fourth transistor T4, and the second electrode of the fourth ferroelectric capacitor C4 is connected to the reference cell plate line RCP.

The conventional ferroelectric memory further includes a reset circuit 105 which is connected to the first reference cell 103 and the second reference cell 104 for writing predetermined data in the reference cells 103 and 104. The reset circuit 105 is formed by a fifth transistor T5 and a sixth transistor T6. The drain of the fifth transistor T5 is connected to the first electrode of the second ferroelectric capacitor C2 at a node ST2. The drain of the sixth transistor T6 is connected to the first electrode of the fourth ferroelectric capacitor C4 at a node ST4.

The gates of the fifth transistor T5 and sixth transistor T6 of the reset circuit 105 are connected to a reset signal line RST. The source of the fifth transistor T5 is connected to an output line RFD0 of a reset driver circuit 106. The source of the sixth transistor T6 is grounded.

The reset driver circuit 106 includes a seventh transistor T7, an eighth transistor T8 and a ninth transistor T9. The drains of the seventh transistor T7 and the eighth transistor T8 are connected to the output line RFD0. The sources of the seventh transistor T7 and the eighth transistor T8 are grounded. The drain of the ninth transistor T9 is connected to the output line RFD0. The source of the ninth transistor T9 is connected to a power supply line. The gate of the seventh transistor T7 is connected to a first reset driver control line XRDIN2. The gate of the eighth transistor T8 is connected to a third reset driver control line RDIN4. The gate of the ninth transistor T9 is connected to a second reset driver control line XRDIN3.

The first bit line BL1 and the second bit line BL2 are grounded through a first bit line precharge circuit 107, which is formed by a tenth transistor T10, and a second bit line precharge circuit 108, which is formed by an eleventh transistor T11, respectively. The first bit line BL1 and the second bit line BL2 are connected to a first sense amplifier 115 as a bit line pair.

As well, the third bit line BL3 and the fourth bit line BL4 are grounded through a third bit line precharge circuit 109, which is formed by a twelfth transistor T12, and a fourth bit line precharge circuit 110, which is formed by a thirteenth transistor T13, respectively. The third bit line BL3 and the fourth bit line BL4 are connected to a second sense amplifier 116 as a bit line pair. The second bit line BL2 and the fourth bit line BL4 are connected to each other through a level equalizer circuit 111 which is formed by the fourteenth transistor T14.

The conventional ferroelectric memory of FIG. 5 further includes a control circuit 120 for controlling the above-described circuits. The control circuit 120 drives the word line WL, the cell plate line CP, the reference word line RWL and the reference cell plate line RCP to control the operations of the first normal cell 101, the second normal cell 102, the first reference cell 103 and the second reference cell 104.

The control circuit 120 controls the reset circuit 105 by driving the reset signal line RST. The control circuit 120 controls the reset driver circuit 106 by driving the first reset driver control line XRDIN2, the second reset driver control line XRDIN3 and the third reset driver control line RDIN4. The control circuit 120 controls the first bit line precharge circuit 107, the second bit line precharge circuit 108, the third bit line precharge circuit 109 and the fourth bit line precharge circuit 110 by driving a bit line precharge control line BP. The control circuit 120 controls the level equalizer circuit 111 by driving a level equalizer control line REQ. The control circuit 120 controls the first sense amplifier 115 and the second sense amplifier 116 by driving a sense amplifier activation line SAE.

The first normal cell 101, the second normal cell 102, the first reference cell 103, the second reference cell 104, the reset circuit 105, the reset driver circuit 106, the first bit line precharge circuit 107, the second bit line precharge circuit 108, the third bit line precharge circuit 109, the fourth bit line precharge circuit 110 and the level equalizer circuit 111 constitute a single memory unit. A plurality of such memory units are connected to the control circuit 120 such that the control circuit 120 can simultaneously control the memory units.

The circuit operation of the conventional ferroelectric memory is described with reference to the drawings. Herein, it is assumed that data "1" is stored in the first normal cell 101, data "0" is stored in the second normal cell 102, data "1" is stored in the first reference cell 103, and data "0" is stored in the second reference cell 104. Data "1" means that the ferroelectric capacitor has a residual dielectric polarization such that the first electrode is positive. Data "0" means that the ferroelectric capacitor has a residual dielectric polarization such that the second electrode is positive.

FIG. 6 illustrates an operation timing of a read operation of the ferroelectric memory shown in FIG. 5. As shown in FIG. 6, in the initial state, the bit line precharge control line BP has "H" level voltage (supply voltage) to be in an active state. Accordingly, the first bit line precharge circuit 107, the second bit line precharge circuit 108, the third bit line precharge circuit 109 and the fourth bit line precharge circuit 110 are driven. Therefore, the potentials of the first bit line BL1, the second bit line BL2, the third bit line BL3 and the fourth bit line BL4 are the ground voltage. At this point in time, the word line WL, the cell plate line CP, the reference word line RWL, the reference cell plate line RCP, the level equalizer control line REQ, the reset signal line RST, the third reset driver control line RDIN4, and the sense amplifier activation line SAE have "L" level voltage (ground voltage) to be in an inactive state. The second reset driver control line XRDIN3 has "H" level voltage to be in an inactive state. The first reset driver control line XRDIN2 has "H" level voltage to be in an active state.

In the first place, at time t00, the bit line precharge control line BP is pulled down to "L" level, whereby the first bit line BL1, the second bit line BL2, the third bit line BL3 and the fourth bit line BL4 are set afloat. At time t01, the level equalizer control line REQ is pulled up to "H" level. At time t02, the word line WL and the reference word line RWL are pulled up to "H" level. At time t03, the cell plate line CP and the reference cell plate line RCP are pulled up to "H" level.

As a result, the first transistor T1, the second transistor T2, the third transistor T3 and the fourth transistor T4 are turned on so that the first ferroelectric capacitor C1, the second ferroelectric capacitor C2, the third ferroelectric capacitor C3 and the fourth ferroelectric capacitor C4 are connected to the first bit line BL1, the second bit line BL2, the third bit line BL3 and the fourth bit line BL4, respectively. In the meantime, the second electrodes of the first ferroelectric capacitor C1, the second ferroelectric capacitor C2, the third ferroelectric capacitor C3 and the fourth ferroelectric capacitor C4 result in "H" level, so that data "1" stored in the first normal cell 101 and data "0" stored in the second normal cell 102 are output to the first bit line BL1 and the third bit line BL3, respectively, and data "1" stored in the first reference cell 103 and data "0" stored in the second reference cell 104 are output to the second bit line BL2 and the fourth bit line BL4, respectively.

At this point in time, the level equalizer control line REQ is at "H" level. Thus, the level equalizer circuit 111 is driven so that the second bit line BL2 and the fourth bit line BL4 are connected. Therefore, the potentials of the second bit line BL2 and the fourth bit line BL4 are equal so that a potential at the midpoint between the potential corresponding to data "1" and the potential corresponding to data "0" is output as the reference potential (reference level) to the second bit line BL2 and the fourth bit line BL4.

Then, at time t05, the reference cell plate line RCP and the cell plate line CP are pulled down to "L" level. At time t06, the reference word line RWL is pulled down to "L" level, whereby the second ferroelectric capacitor C2 and the fourth ferroelectric capacitor C4 are disconnected from the second bit line BL2 and the fourth bit line BL4, respectively. Thereafter, at time t07, the level equalizer control line REQ is pulled down to "L" level so that the level equalizer circuit 111 is turned off.

Then, at time t09, the sense amplifier activation signal SAE is pulled up to "H" level, whereby the difference between the potentials read into the first bit line BL1 and the second bit line BL2 is amplified by the first sense amplifier 115, and the difference between the potentials read into the third bit line BL3 and the fourth bit line BL4 is amplified by the second sense amplifier 116. As a result, the first bit line BL1 is at the supply voltage, the second bit line BL2 is at the ground voltage, the third bit line BL3 is at the ground voltage, and the fourth bit line BL4 is at the supply voltage.

At this point in time, the word line WL is at "H" level. Thus, the first electrode of the first ferroelectric capacitor C1 is at "H" level, and the first electrode of the third ferroelectric capacitor C3 is at "L" level.

In the meantime, at time t09, the first reset driver control line XRDIN2 is pulled down to "L" level, and the second reset driver control line XRDIN3 is pulled down to "L" level. As a result, the reset driver output line RFD0 rises to "H" level. At the same time, the reset signal line RST is pulled up to "H" level. Thus, the first electrode of the second ferroelectric capacitor C2 (node ST2) results in "H" level, and the first electrode of the fourth ferroelectric capacitor C4 (node ST4) results in "L" level.

Then, at time t10, the cell plate line CP and the reference cell plate line RCP are pulled up to "H" level, whereby data "0" is rewritten in the third ferroelectric capacitor C3 of the second normal cell 102 and the fourth ferroelectric capacitor C4 of the second reference cell 104.

Thereafter, at time t12, the reference cell plate line RCP and the cell plate line CP are pulled down to "L" level, whereby data "1" is rewritten in the first ferroelectric capacitor C1 of the first normal cell 101 and the second ferroelectric capacitor C2 of the first reference cell 103.

At time t14, the second reset driver control line XRDIN3 is pulled up to "H" level so that the ninth transistor T9 is turned off, and the third reset driver control line RDIN4 is pulled up to "H" level so that the eighth transistor T8 is turned on, whereby discharge of the node ST2 is started. In the meantime, the sense amplifier activation signal SAE is pulled down to "L" level. Then, at time t15, the first reset driver control line XRDIN2 is pulled up to "H" level so that the seventh transistor T7 is turned on, and the third reset driver control line RDIN4 is pulled down to "L" level so that the eighth transistor T8 is turned off, whereby discharge of the node ST2 is continued. Further, the bit line precharge control line BP is pulled up to "H" level, whereby discharge of the first bit line BL1, the second bit line BL2, the third bit line BL3 and the fourth bit line BL4 is started.

Then, at time t16, after the end of the discharge of the node ST2 and the first bit line BL1, the reset signal line RST and the word line WL are pulled down to "L" level so that the ferroelectric memory is restored to the initial state, whereby one cycle of the read operation is terminated.

In such a conventional ferroelectric memory, if the bit line precharge control line BP is pulled up to "H" level at time t15, the first bit line precharge circuit 107 is driven, and the first bit line BL1 is grounded. Thus, the first bit line BL1 transitions from "H" level to "L" level. At this point in time, the word line WL is at "H" level, and therefore, the first transistor T1 is on. The potential at the first electrode of the first ferroelectric capacitor C1 also abruptly transitions from "H" level to "L" level. This abrupt potential transition influences the cell plate line CP due to coupling of the first ferroelectric capacitor C1. Thus, as indicated by broken line circle A, undershoot noise is caused in the cell plate line CP which is at "L" level.

If the undershoot noise is caused in the cell plate line CP, the amount of polarized charges of a ferroelectric capacitor which holds data "0" is decreased by a mechanism described below, so that the reliability of the ferroelectric memory deteriorates.

FIG. 7 shows a hysteresis curve for a memory cell of the conventional ferroelectric memory. In FIG. 7, the horizontal axis represents the voltage applied to an electrode of a ferroelectric capacitor, ant the vertical axis represents the amount of polarized charges of the ferroelectric capacitor.

At time t15, the first electrode and the second electrode of the third ferroelectric capacitor C3 are both at the ground potential, and therefore, the polarized charge amount of the third ferroelectric capacitor C3 is at point G. However, if the voltage of the cell plate line CP connected to the second electrode is decreased from the ground potential to voltage —Vp due to the undershoot noise, voltage —Vp is applied between the first electrode and the second electrode of the third ferroelectric capacitor C3, and therefore, the polarized charge amount of the third ferroelectric capacitor C3 temporarily moves to point X. Since the polarized charge amount changes to draw a hysteresis curve, the polarized charge amount moves to point Y without returning to point G even when the cell plate line CP is restored to the ground potential, and the polarized charge amount decreases from 2P to 2Q. As a result, the potential difference between data "1" and data "0" becomes small in a data read operation, so that the potential difference between data "1" and data "0" is smaller than a potential which can be read by the sense amplifier. Therefore, there is a possibility that stored data is corrupted. Thus, the noise caused in the cell plate line deteriorates the nonvolatility of the ferroelectric memory and therefore greatly deteriorates the reliability of the ferroelectric memory.

In order to prevent the above-described deterioration of the reliability of the ferroelectric memory, the speed of discharging the bit lines is decreased as much as possible by using, for example, a slow transistor as the eighth transistor T8 such that the potential at the first electrode of the ferroelectric capacitor does not abruptly change as shown in FIG. 8.

However, if the speed of discharging the bit line is decreased, the cycle time of the ferroelectric memory becomes longer, and the operation speed of the memory decreases.

SUMMARY OF THE INVENTION

The present invention solves the above-described problems. An objective of the present invention is to realize a highly-reliable, high-speed ferroelectric memory.

In order to achieve the above objective, the present invention provides a 1-transistor/1-ferroelectric capacitor type ferroelectric memory which includes a normal cell for storing data and a reference potential generation circuit, wherein a bit line is discharged after a ferroelectric capacitor which holds data is disconnected from the bit line.

Specifically, a ferroelectric memory of the present invention comprises: a plurality of normal cells, each of which includes a first ferroelectric capacitor for holding data and a first transistor connected to a first electrode of the first ferroelectric capacitor; a first bit line connected to the first transistor; a first bit line precharge circuit which is a switch circuit provided between the first bit line and a ground; and a word line connected to a gate of the first transistor, wherein the word line is deactivated to disconnect the first ferroelectric capacitor from the first bit line before the first bit line precharge circuit is driven to discharge a potential of the first bit line.

According to the ferroelectric memory of the present invention, even when the first bit line is discharged at a high speed, the potential of the first electrode of the first ferroelectric capacitor does not change. Thus, undershoot noise is not caused in the cell plate line. Therefore, since the discharge of the first bit line is executed at a high speed, the cycle time is shortened. As a result, a highly-reliable, high-speed ferroelectric memory is realized.

Preferably, the ferroelectric memory of the present invention further comprises a cell plate line connected to a second electrode of the first ferroelectric capacitor, wherein in the process of reading data from each of the normal cells, the cell plate line is activated prior to the word line. With this feature, even when electric charges are remaining in the first electrode of the first ferroelectric capacitor, occurrence of overshoot noise in the cell plate line is prevented.

Preferably, the ferroelectric memory of the present invention further comprises: a plurality of reference potential generation circuits; a plurality of sense amplifiers, each of which is connected to the first bit line and a corresponding one of the reference potential generation circuits and amplifies the potential difference between the potential of the first bit line and a reference potential generated by the corresponding reference potential generation circuit; a plurality of second bit lines connected to the reference potential generation circuits; a second bit line precharge circuit which is a switch circuit connected to the second bit lines; and a plurality of reset circuits, wherein the reference potential generation circuits are a plurality of reference cells connected to the sense amplifiers through the second bit lines, each of the reference cells includes a second ferroelectric capacitor for holding data, and a second transistor connected to a first electrode of the second ferroelectric capacitor, the second transistor is connected to a corresponding one of the second bit lines, a gate of the second transistor is connected to a reference word line, a second electrode of the second ferroelectric capacitor is connected to a reference cell plate line, adjacent two of the reference cells are connected to a corresponding one of the reset circuits which writes different data in the adjacent two reference cells, and the second bit lines connected to the adjacent two reference cells are connected to each other through a level equalizer circuit which is a switch circuit. With this structure, a reference voltage is surely generated.

Preferably, in the ferroelectric memory of the present invention, the waveform of a signal applied to the reference cell plate line is synchronous with the waveform of a signal applied to the cell plate line. With this structure, the cell plate line and the reference cell plate line are commonly provided, and therefore, the control is simplified.

Preferably, in the ferroelectric memory of the present invention, the waveform of a signal applied to the reference cell plate line is asynchronous with the waveform of a signal applied to the cell plate line. With this structure, the reference cell and the normal cell are separately controlled.

Preferably, in the ferroelectric memory of the present invention, the speed of discharging the potential of a first electrode of the second ferroelectric capacitor from a supply voltage to a ground voltage is slower than the speed of discharging the potential of the first bit line from the supply voltage to the ground voltage. With this structure, occurrence of noise in the reference cell plate line is prevented, and a precise reference potential is surely generated.

Preferably, in the ferroelectric memory of the present invention, the operation of discharging the potential of a first electrode of the second ferroelectric capacitor from the supply voltage to the ground voltage is started prior to the operation of discharging the potential of the first bit line from the supply voltage to the ground voltage. With this structure, the cycle time is surely shortened.

Preferably, the ferroelectric memory of the present invention further comprises: a plurality of reference potential generation circuits; a plurality of sense amplifiers, each of which is connected to the first bit line and a corresponding one of the reference potential generation circuits and amplifies the potential difference between the potential of the first bit line and a reference potential generated by the corresponding reference potential generation circuit; a plurality of second bit lines connected to the reference potential generation circuits; a second bit line precharge circuit which is a switch circuit connected to the second bit lines; and a plurality of reset circuits, wherein the reference potential generation circuits are a plurality of reference cells connected to the sense amplifiers through the second bit lines, each of the reference cells includes a second ferroelectric capacitor for holding data, and a second transistor connected to a first electrode of the second ferroelectric capacitor, the second transistor is connected to a corresponding one of the second bit lines, a gate of the second transistor is connected to a reference word line, adjacent two of the reference cells are connected to a corresponding one of the reset circuits which writes different data in the adjacent two reference cells, the second bit lines connected to the adjacent two reference cells are connected to each other through a level equalizer circuit which is a switch circuit, a second electrode of one of the second ferroelectric capacitors which holds one of the different data written by the reset circuit is connected to a first reference cell plate line, and a second electrode of one of the second ferroelectric capacitors which holds the other of the different data written by the reset circuit is connected to a second reference cell plate line.

In this structure, reference cells storing different data are connected to different reference cell plate lines. Thus, the second electrode of a ferroelectric capacitor in each reference cell which stores data "1" and the second electrode of a ferroelectric capacitor in each reference cell which stores data "0" are reference cell plate lines which are independent of each other. Therefore, even when the potential of the first electrode of the ferroelectric capacitor which holds data "1" is discharged at a high speed, the polarized charge amount of the ferroelectric capacitor which holds data "0" does not decrease. As a result, a highly-reliable, high-speed ferroelectric memory is realized.

There is provided a method for reading data from a ferroelectric memory according to the present invention, the ferroelectric memory including a plurality of normal cells, each of which includes a first ferroelectric capacitor for holding data and a first transistor connected to a first electrode of the first ferroelectric capacitor, a first bit line connected to the first transistor, a first bit line precharge circuit which is a switch circuit connected to the first bit line, a cell plate line connected to a second electrode of the first ferroelectric capacitor, and a word line connected to a gate of the first transistor, the method comprising the steps of: activating the cell plate line; activating the word line; deactivating the word line; and driving the first bit line precharge circuit after the step of deactivating the word line.

According to the ferroelectric memory reading method of the present invention, noise is not caused in the cell plate line even when the bit line is discharged at a high speed. Thus, the polarized charge amount of the ferroelectric capacitor does not decrease. As a result, the reliability of the ferroelectric memory improves, and the ferroelectric memory is capable of high speed operation.

Preferably, in the ferroelectric memory reading method of the present invention, the step of activating the cell plate line is executed before the step of activating the word line. With this structure, even when electric charges are remaining in the first electrode of the first ferroelectric capacitor, occurrence of upward noise in the cell plate line is prevented.

According to a ferroelectric memory of the present invention, in the process of discharging a bit line, corruption of data stored in a normal cell is prevented, and the cycle time is shortened. Thus, a highly-reliable, high-speed ferroelectric memory is realized.

DESCRIPTION OF THE PREFERRED EMBODIMENTS

Embodiment 1

A ferroelectric memory of embodiment 1 of the present invention is described with reference to FIGS. 1 and 2.

Figure 1:
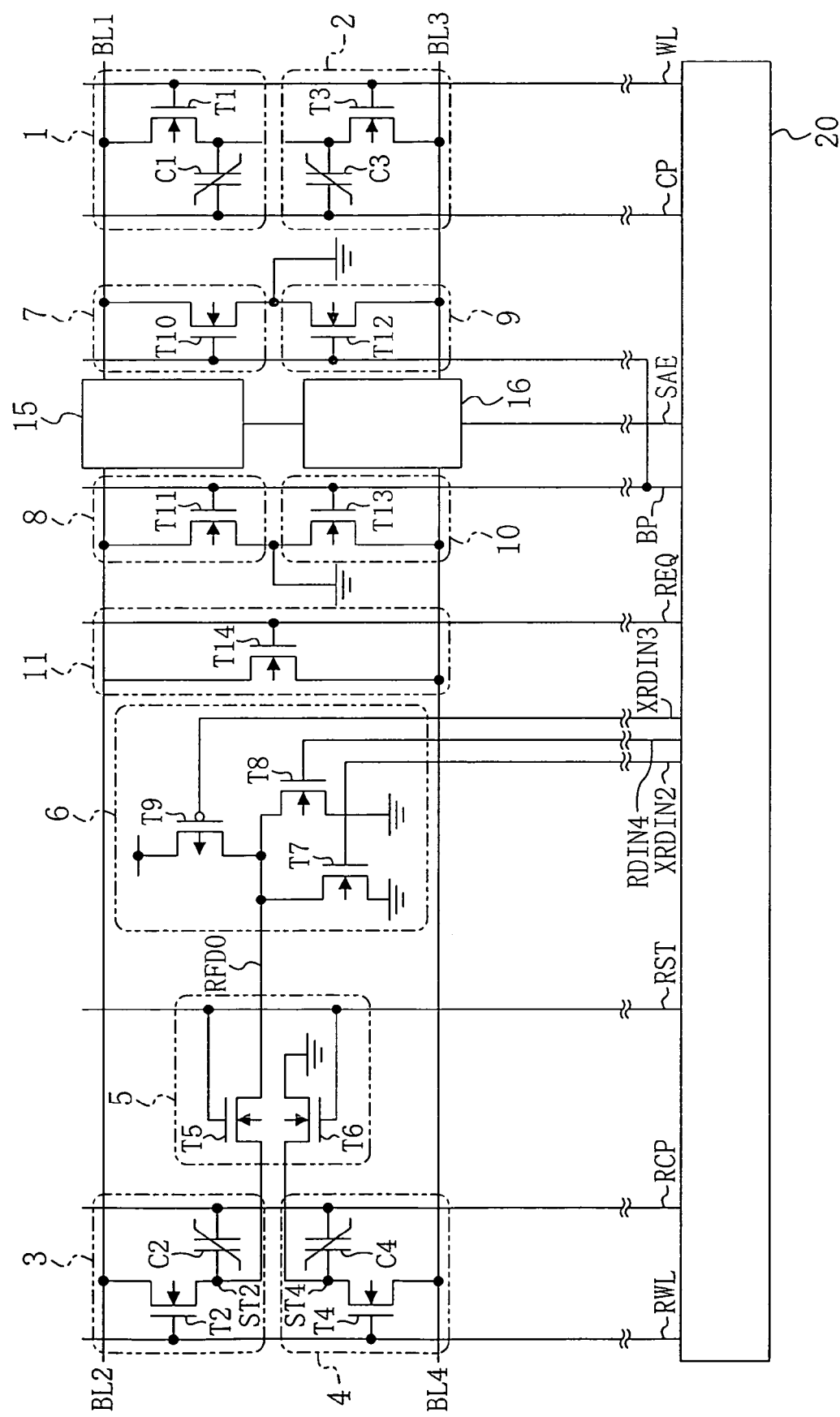
FIG. 1 is a circuit diagram showing a structure of a ferroelectric memory according to embodiments 1 and 2.

FIG. 1 shows a circuit structure of a ferroelectric memory according to embodiments 1 and 2 of the present invention. FIG. 2 illustrates an operation timing of the ferroelectric memory according to embodiment 1.

As shown in FIG. 1, the ferroelectric memory of embodiment 1 includes a first normal cell 1 and a second normal cell 2 as memory cells for storing data. The first normal cell 1 is formed by a first transistor T1 and a first ferroelectric capacitor C1. The gate of the first transistor T1 is connected to a word line WL, and the drain of the first transistor T1 is connected to a first bit line BL1. The first electrode of the first ferroelectric capacitor C1 is connected to the source of the first transistor T1, and the second electrode of the first ferroelectric capacitor C1 is connected to a cell plate line CP. The second normal cell 2 is formed by a third transistor T3 and a third ferroelectric capacitor C3. The gate of the third transistor T3 is connected to the word line WL, and the drain of the third transistor T3 is connected to a third bit line BL3. The first electrode of the third ferroelectric capacitor C3 is connected to the source of the third transistor T3, and the second electrode of the third ferroelectric capacitor C3 is connected to the cell plate line CP.

The ferroelectric memory of FIG. 1 includes a first reference cell 3 and a second reference cell 4 as memory cells for storing data used for generation of a reference potential. The first reference cell 3 is formed by a second transistor T2 and a second ferroelectric capacitor C2. The gate of the second transistor T2 is connected to a reference word line RWL, and the drain of the second transistor T2 is connected to a second bit line BL2. The first electrode of the second ferroelectric capacitor C2 is connected to the source of the second transistor T2, and the second electrode of the second ferroelectric capacitor C2 is connected to a reference cell plate line RCP. The second reference cell 4 is formed by a fourth transistor T4 and a fourth ferroelectric capacitor C4. The gate of the fourth transistor T4 is connected to the reference word line RWL, and the drain of the fourth transistor T4 is connected to a fourth bit line BL4. The first electrode of the fourth ferroelectric capacitor C4 is connected to the source of the fourth transistor T4, and the second electrode of the fourth ferroelectric capacitor C4 is connected to the reference cell plate line RCP.

The ferroelectric memory of FIG. 1 further includes a reset circuit 5 which is connected to the first reference cell 3 and the second reference cell 4 for writing predetermined data in the reference cells 3 and 4. The reset circuit 5 is formed by a fifth transistor T5 and a sixth transistor T6. The drain of the fifth transistor T5 is connected to the first electrode of the second ferroelectric capacitor C2 at a node ST2. The drain of the sixth transistor T6 is connected to the first electrode of the fourth ferroelectric capacitor C4 at a node ST4.

The gates of the fifth transistor T5 and sixth transistor T6 of the reset circuit 5 are connected to a reset signal line RST. The source of the fifth transistor T5 is connected to an output line RFD0 of a reset driver circuit 6. The source of the sixth transistor T6 is grounded.

The reset driver circuit 6 includes a seventh transistor T7, an eighth transistor T8 and a ninth transistor T9. The drains of the seventh transistor T7 and the eighth transistor T8 are connected to the output line RFD0. The sources of the seventh transistor T7 and the eighth transistor T8 are grounded. The drain of the ninth transistor T9 is connected to the output line RFD0. The source of the ninth transistor T9 is connected to a power supply line. The gate of the seventh transistor T7 is connected to a first reset driver control line XRDIN2. The gate of the eighth transistor T8 is connected to a third reset driver control line RDIN4. The gate of the ninth transistor T9 is connected to a second reset driver control line XRDIN3.

The first bit line BL1 and the second bit line BL2 are grounded through a first bit line precharge circuit 7, which is formed by a tenth transistor T10, and a second bit line precharge circuit 8, which is formed by an eleventh transistor T11, respectively. The first bit line BL1 and the second bit line BL2 are connected to a first sense amplifier 15 as a bit line pair.

As well, the third bit line BL3 and the fourth bit line BL4 are grounded through a third bit line precharge circuit 9, which is formed by a twelfth transistor T12, and a fourth bit line precharge circuit 10, which is formed by a thirteenth transistor T13, respectively. The third bit line BL3 and the fourth bit line BL4 are connected to a second sense amplifier 16 as a bit line pair. The second bit line BL2 and the fourth bit line BL4 are connected to each other through a level equalizer circuit 11 which is formed by the fourteenth transistor T14.

The ferroelectric memory of FIG. 1 further includes a control circuit 20 for controlling the above-described circuits. The control circuit 20 drives the word line WL, the cell plate line CP, the reference word line RWL and the reference cell plate line RCP to control the operations of the first normal cell 1, the second normal cell 2, the first reference cell 3 and the second reference cell 4.

The control circuit 20 controls the reset circuit 5 by driving the reset signal line RST. The control circuit 20 controls the reset driver circuit 6 by driving the first reset driver control line XRDIN2, the second reset driver control line XRDIN3 and the third reset driver control line RDIN4. The control circuit 20 controls the first bit line precharge circuit 7, the second bit line precharge circuit 8, the third bit line precharge circuit 9 and the fourth bit line precharge circuit 10 by driving a bit line precharge control line BP. The control circuit 20 controls the level equalizer circuit 11 by driving a level equalizer control line REQ. The control circuit 20 controls the first sense amplifier 15 and the second sense amplifier 16 by driving a sense amplifier activation line SAE.

The first normal cell 1, the second normal cell 2, the first reference cell 3, the second reference cell 4, the reset circuit 5, the reset driver circuit 6, the first bit line precharge circuit 7, the second bit line precharge circuit 8, the third bit line precharge circuit 9, the fourth bit line precharge circuit 10 and the level equalizer circuit 11 constitute a single memory unit. A plurality of such memory units are connected to the control circuit 20 such that the control circuit 20 can simultaneously control the memory units.

Next, a circuit operation of the ferroelectric memory of embodiment 1 is described with reference to FIG. 2. Herein, it is assumed that data "1" is stored in the first normal cell 1, data "0" is stored in the second normal cell 2, data "1" is stored in the first reference cell 3, and data "0" is stored in the second reference cell 4. Data "1" means that the ferroelectric capacitor has a residual dielectric polarization such that the first electrode is positive. Data "0" means that the ferroelectric capacitor has a residual dielectric polarization such that the second electrode is positive.

Figure 2:
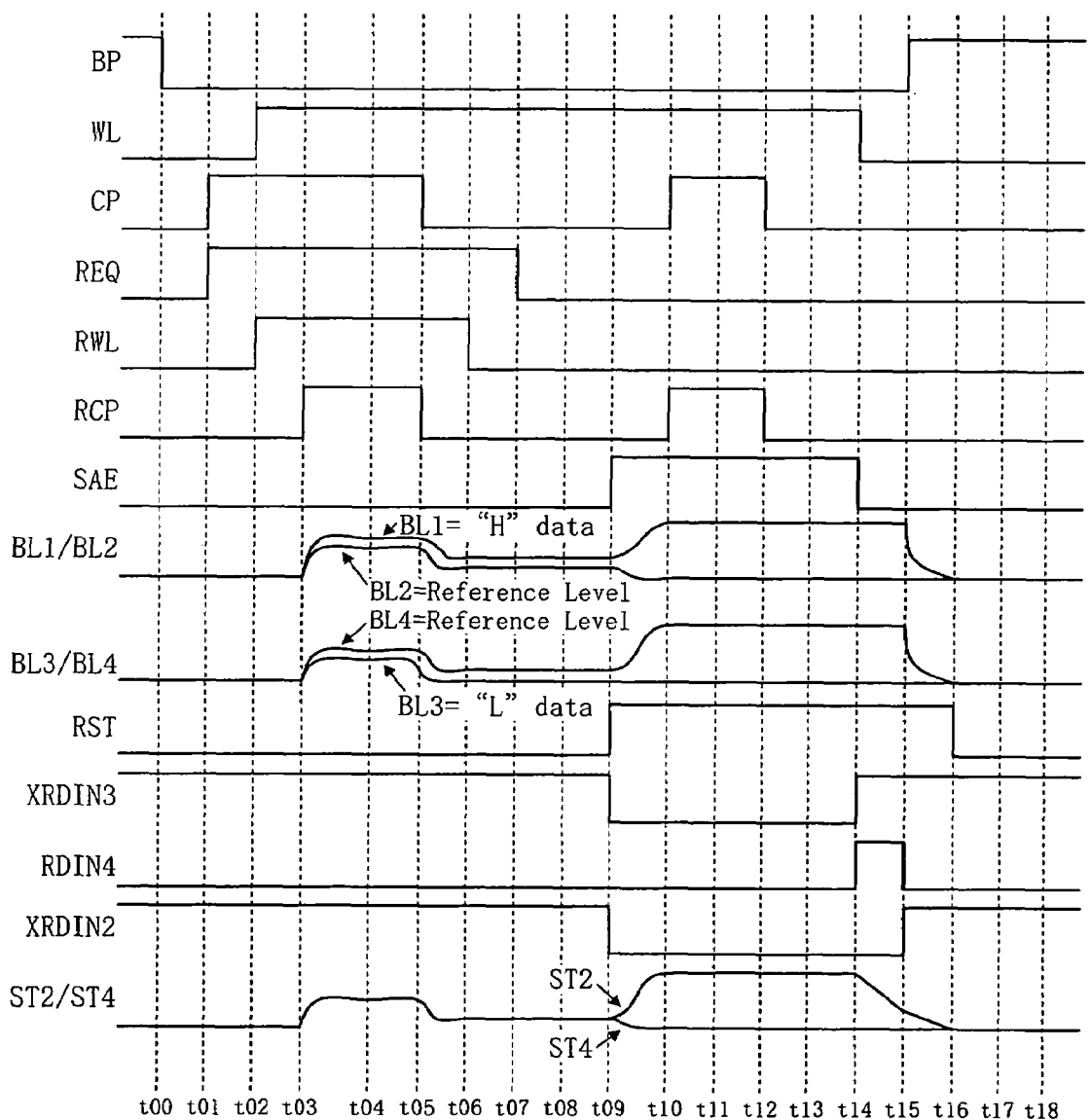
FIG. 2 is a timing chart which illustrates an operation timing of the ferroelectric memory according to embodiment 1.

As shown in FIG. 2, in the initial state, the bit line precharge control line BP has "H" level voltage (supply voltage) to be in an active state. Accordingly, the first bit line precharge circuit 7, the second bit line precharge circuit 8, the third bit line precharge circuit 9 and the fourth bit line precharge circuit 10 are driven. Therefore, the potentials of the first bit line BL1, the second bit line BL2, the third bit line BL3 and the fourth bit line BL4 are the ground voltage. At this point in time, the word line WL, the cell plate line CP, the reference word line RWL, the reference cell plate line RCP, the level equalizer control line REQ, the reset signal line RST, the third reset driver control line RDIN4, and the sense amplifier activation line SAE have "L" level voltage (ground voltage) to be in an inactive state. The second reset driver control line XRDIN3 has "H" level voltage to be in an inactive state. The first reset driver control line XRDIN2 has "H" level voltage to be in an active state.

In the first place, at time t00, the bit line precharge control line BP is pulled down to "L" level, whereby the first bit line BL1, the second bit line BL2, the third bit line BL3 and the fourth bit line BL4 are set afloat. At time t01, the level equalizer control line REQ is pulled up to "H" level, and the cell plate line CP is pulled up to "H" level. At time t02, the word line WL and the reference word line RWL are pulled up to "H" level. At time t03, the reference cell plate line RCP is pulled up to "H" level.

As a result, the first transistor T1, the second transistor T2, the third transistor T3 and the fourth transistor T4 are turned on so that the first ferroelectric capacitor C1, the second ferroelectric capacitor C2, the third ferroelectric capacitor C3 and the fourth ferroelectric capacitor C4 are connected to the first bit line BL1, the second bit line BL2, the third bit line BL3 and the fourth bit line BL4, respectively. In the meantime, the second electrodes of the first ferroelectric capacitor C1, the second ferroelectric capacitor C2, the third ferroelectric capacitor C3 and the fourth ferroelectric capacitor C4 result in "H" level, so that data "1" stored in the first normal cell 1 and data "0" stored in the second normal cell 2 are output to the first bit line BL1 and the third bit line BL3, respectively, and data "1" stored in the first reference cell 3 and data "0" stored in the second reference cell 4 are output to the second bit line BL2 and the fourth bit line BL4, respectively.

At this point in time, the level equalizer control line REQ is at "H" level. Thus, the level equalizer circuit 11 is driven so that the second bit line BL2 and the fourth bit line BL4 are connected. Therefore, the potentials of the second bit line BL2 and the fourth bit line BL4 are equal so that a potential at the midpoint between the potential corresponding to data "1" and the potential corresponding to data "0" is output as the reference potential (reference level) to the second bit line BL2 and the fourth bit line BL4.

Then, at time t05, the reference cell plate line RCP and the cell plate line CP are pulled down to "L" level. At time t06, the reference word line RWL is pulled down to "L" level, whereby the second ferroelectric capacitor C2 and the fourth ferroelectric capacitor C4 are disconnected from the second bit line BL2 and the fourth bit line BL4, respectively. Thereafter, at time t07, the level equalizer control line REQ is pulled down to "L" level so that the level equalizer circuit 11 is turned off.

Then, at time t09, the sense amplifier activation signal SAE is pulled up to "H" level, whereby the difference between the potentials read into the first bit line BL1 and the second bit line BL2 is amplified by the first sense amplifier 15, and the difference between the potentials read into the third bit line BL3 and the fourth bit line BL4 is amplified by the second sense amplifier 16. As a result, the first bit line BL1 is at the supply voltage, the second bit line BL2 is at the ground voltage, the third bit line BL3 is at the ground voltage, and the fourth bit line BL4 is at the supply voltage.

At this point in time, the word line WL is at "H" level. Thus, the first electrode of the first ferroelectric capacitor C1 is at "H" level, and the first electrode of the third ferroelectric capacitor C3 is at "L" level.

In the meantime, at time t09, the first reset driver control line XRDIN2 is pulled down to "L" level, and the second reset driver control line XRDIN3 is pulled down to "L" level. As a result, the reset driver output line RFD0 rises to "H" level. At the same time, the reset signal line RST is pulled up to "H" level. Thus, the first electrode of the second ferroelectric capacitor C2 (node ST2) results in "H" level, and the first electrode of the fourth ferroelectric capacitor C4 (node ST4) results in "L" level.

Then, at time t10, the cell plate line CP and the reference cell plate line RCP are pulled up to "H" level, whereby data "0" is rewritten in the third ferroelectric capacitor C3 of the second normal cell 2 and the fourth ferroelectric capacitor C4 of the second reference cell 4.

Thereafter, at time t12, the reference cell plate line RCP and the cell plate line CP are pulled down to "L" level, whereby data "1" is rewritten in the first ferroelectric capacitor C1 of the first normal cell 1 and the second ferroelectric capacitor C2 of the first reference cell 3.

At time t14, the second reset driver control line XRDIN3 is pulled up to "H" level so that the ninth transistor T9 is turned off, and the third reset driver control line RDIN4 is pulled up to "H" level so that the eighth transistor T8 is turned on, whereby discharge of the node ST2 is started. In the meantime, the sense amplifier activation signal SAE is pulled down to "L" level, and simultaneously, the word line WL is pulled down to "L" level, such that the first transistor T1 and the third transistor T3 are turned off, whereby the first ferroelectric capacitor C1 and the third ferroelectric capacitor C3 are disconnected from the first bit line BL1 and the third bit line BL3, respectively.

Then, at time t15, the first reset driver control line XRDIN2 is pulled up to "H" level so that the seventh transistor T7 is turned on, and the third reset driver control line RDIN4 is pulled down to "L" level so that the eighth transistor T8 is turned off, whereby discharge of the node ST2 is continued. Further, the bit line precharge control line BP is pulled up to "H" level, whereby discharge of the first bit line BL1, the second bit line BL2, the third bit line BL3 and the fourth bit line BL4 is started.

Lastly, at time t16, after the end of the discharge of the node ST2, the reset signal line RST is pulled down to "L" level so that the ferroelectric memory is restored to the initial state, whereby one cycle of the read operation is terminated.

According to embodiment 1, the word line WL is pulled down to "L" level at time 14 such that the first ferroelectric capacitor C1 is disconnected from the first bit line BL1, and thereafter, the bit line precharge control line BP is pulled up to "H" level at time t15. Thus, even if the first bit line BL1 is discharged at a high speed, the potential at the first electrode of the first ferroelectric capacitor C1 does not change. Therefore, undershoot noise is not caused in the cell plate line CP.

In the case of reading stored data from the first memory cell 1 where electric charges are remaining at the first electrode of the first ferroelectric capacitor C1, if the word line WL is pulled up to "H" level before the cell plate line CP is pulled up to "H" level, upward noise is caused in the cell plate line CP due to the coupling of the second ferroelectric capacitor C2 because the electric charges are remaining at the first electrode of the first ferroelectric capacitor C1. As a result, the polarized charge amount of the third ferroelectric capacitor C3 in which data "0" is held is decreased. In order to prevent this problem, according to embodiment 1, the cell plate line CP is pulled up to "H" level at time t01.

As described above, in the ferroelectric memory of embodiment 1, a bit line is discharged after the word line WL is deactivated in a normal cell, and charges of "H" level are left in the first electrode of a ferroelectric capacitor. With this operation, occurrence of undershoot noise in a cell plate line is prevented. As a result, a decrease of the polarized charge amount in the ferroelectric capacitor which holds data "0" is prevented, whereby the nonvolatility and reliability of the ferroelectric memory are improved. Further, it is possible to discharge the bit line at a high speed. Thus, the cycle time is shortened, and a high-speed ferroelectric memory is realized.

According to embodiment 1, the first electrode of the second ferroelectric capacitor C2 of the first reference cell 3 (node ST2) is discharged after rewriting of data "1", whereby the electric charges of "H" level are removed. Further, the speed of discharging the node ST2 is slower than the speed of discharging the first bit line BL1 by using a slow transistor as the eighth transistor T8. With this structure, occurrence of noise in a cell plate line of a reference cell is suppressed, and a correct reference potential is generated. Thus, the reliability of the ferroelectric memory is improved.

In embodiment 1, the discharge of the node ST2 is started prior to the discharge of the first bit line BL1. Since the discharge of the node ST2, which requires a longer time for discharge as compared with the first bit line BL1, is started prior to the discharge of the first bit line BL1, the cycle time is shortened, and a high-speed ferroelectric memory is realized.

Embodiment 2

Hereinafter, a ferroelectric memory of embodiment 2 of the present invention is described with reference to FIGS. 1 and 3.

FIG. 1 shows a circuit structure of a ferroelectric memory according to embodiments 1 and 2 of the present invention. FIG. 3 illustrates an operation timing of the ferroelectric memory according to embodiment 2. The descriptions of the circuit structure of FIG. 1 are the same as those provided in embodiment 1 and are therefore omitted herein.

Next, a circuit operation of the ferroelectric memory of embodiment 2 is described with reference to FIG. 3. Herein, it is assumed that data "1" is stored in the first normal cell 1, data "0" is stored in the second normal cell 2, data "1" is stored in the first reference cell 3, and data "0" is stored in the second reference cell 4. Data "1" means that the ferroelectric capacitor has a residual dielectric polarization such that the first electrode is positive. Data "0" means that the ferroelectric capacitor has a residual dielectric polarization such that the second electrode is positive.

Figure 3:
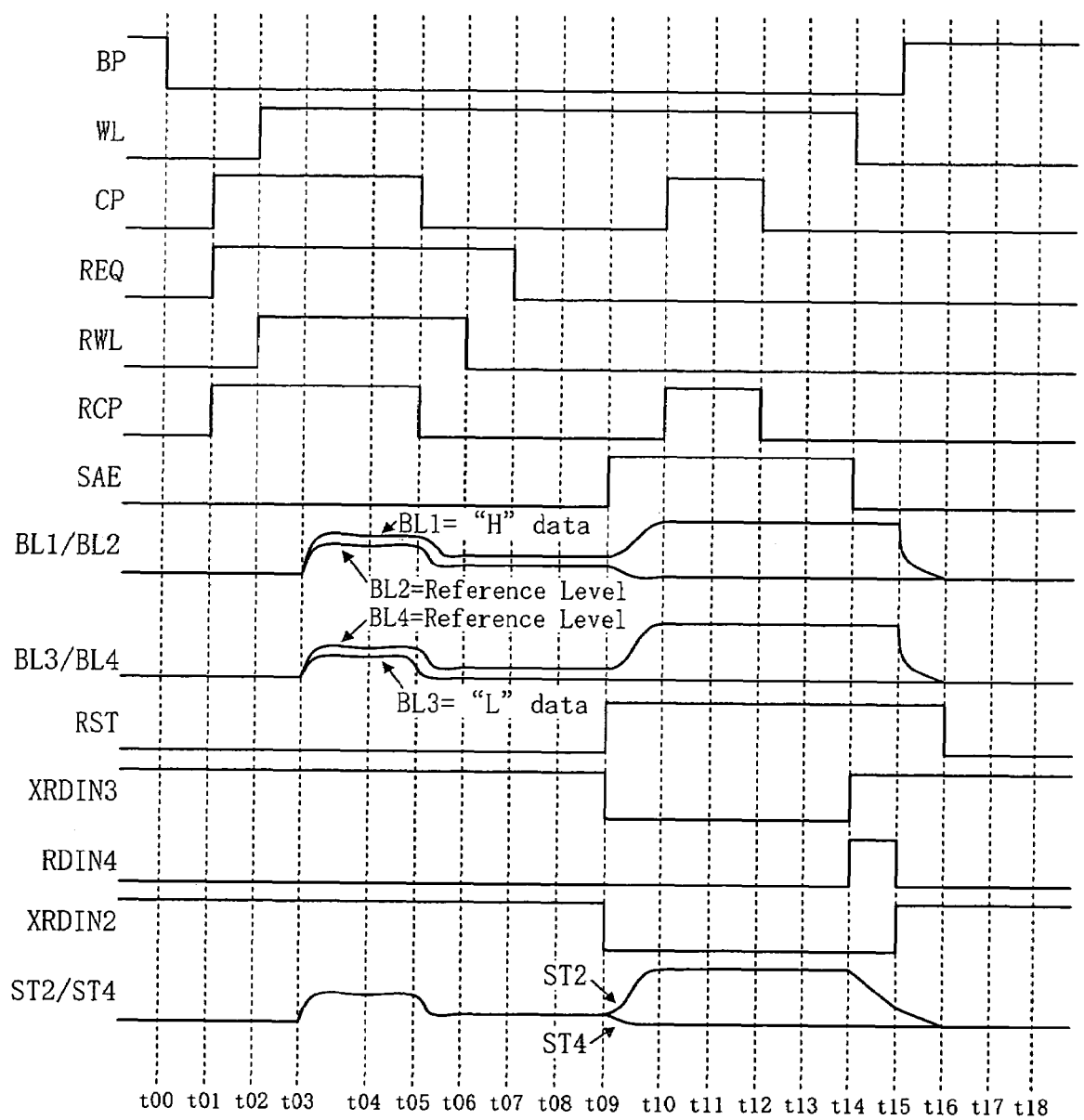
FIG. 3 is a timing chart which illustrates an operation timing of the ferroelectric memory according to embodiment 2.

As shown in FIG. 3, in the initial state, the bit line precharge control line BP has "H" level voltage (supply voltage) to be in an active state. Accordingly, the first bit line precharge circuit 7, the second bit line precharge circuit 8, the third bit line precharge circuit 9 and the fourth bit line precharge circuit 10 are driven. Therefore, the potentials of the first bit line BL1, the second bit line BL2, the third bit line BL3 and the fourth bit line BL4 are the ground voltage.

At this point in time, the word line WL, the cell plate line CP, the reference word line RWL, the reference cell plate line RCP, the level equalizer control line REQ, the reset signal line RST, the third reset driver control line RDIN4, and the sense amplifier activation line SAE have "L" level voltage (ground voltage) to be in an inactive state. The second reset driver control line XRDIN3 has "H" level voltage to be in an inactive state. The first reset driver control line XRDIN2 has "H" level voltage to be in an active state.

In the first place, at time t00, the bit line precharge control line BP is pulled down to "L" level, whereby the first bit line BL1, the second bit line BL2, the third bit line BL3 and the fourth bit line BL4 are set afloat. At time t01, the level equalizer control line REQ is pulled up to "H" level, and the cell plate line CP and the reference cell plate line RCP are pulled up to "H" level. At time t02, the word line WL and the reference word line RWL are pulled up to "H" level.

As a result, the first transistor T1, the second transistor T2, the third transistor T3 and the fourth transistor T4 are turned on so that the first ferroelectric capacitor C1, the second ferroelectric capacitor C2, the third ferroelectric capacitor C3 and the fourth ferroelectric capacitor C4 are connected to the first bit line BL1, the second bit line BL2, the third bit line BL3 and the fourth bit line BL4, respectively. In the meantime, the second electrodes of the first ferroelectric capacitor C1, the second ferroelectric capacitor C2, the third ferroelectric capacitor C3 and the fourth ferroelectric capacitor C4 result in "H" level, so that data "1" stored in the first normal cell 1 and data "0" stored in the second normal cell 2 are output to the first bit line BL1 and the third bit line BL3, respectively, and data "1" stored in the first reference cell 3 and data "0" stored in the second reference cell 4 are output to the second bit line BL2 and the fourth bit line BL4, respectively.

At this point in time, the level equalizer control line REQ is at "H" level. Thus, the level equalizer circuit 11 is driven so that the second bit line BL2 and the fourth bit line BL4 are connected. Therefore, the potentials of the second bit line BL2 and the fourth bit line BL4 are equal so that a potential at the midpoint between the potential corresponding to data "1" and the potential corresponding to data "0" is output as the reference potential (reference level) to the second bit line BL2 and the fourth bit line BL4.

Then, at time t05, the reference cell plate line RCP and the cell plate line CP are pulled down to "L" level. At time t06, the reference word line RWL is pulled down to "L" level, whereby the second ferroelectric capacitor C2 and the fourth ferroelectric capacitor C4 are disconnected from the second bit line BL2 and the fourth bit line BL4, respectively. Thereafter, at time t07, the level equalizer control line REQ is pulled down to "L" level so that the level equalizer circuit 11 is turned off.

Then, at time t09, the sense amplifier activation signal SAE is pulled up to "H" level, whereby the difference between the potentials read into the first bit line BL1 and the second bit line BL2 is amplified by the first sense amplifier 15, and the difference between the potentials read into the third bit line BL3 and the fourth bit line BL4 is amplified by the second sense amplifier 16. As a result, the first bit line BL1 is at the supply voltage, the second bit line BL2 is at the ground voltage, the third bit line BL3 is at the ground voltage, and the fourth bit line BL4 is at the supply voltage.

At this point in time, the word line WL is at "H" level. Thus, the first electrode of the first ferroelectric capacitor C1 is at "H" level, and the first electrode of the third ferroelectric capacitor C3 is at "L" level.

In the meantime, at time t09, the first reset driver control line XRDIN2 is pulled down to "L" level, and the second reset driver control line XRDIN3 is pulled down to "L" level. As a result, the reset driver output line RFD0 rises to "H" level. At the same time, the reset signal line RST is pulled up to "H" level. Thus, the first electrode of the second ferroelectric capacitor C2 (node ST2) results in "H" level, and the first electrode of the fourth ferroelectric capacitor C4 (node ST4) results in "L" level.

Then, at time t10, the cell plate line CP and the reference cell plate line RCP are pulled up to "H" level, whereby data "0" is rewritten in the third ferroelectric capacitor C3 of the second normal cell 2 and the fourth ferroelectric capacitor C4 of the second reference cell 4.

Thereafter, at time t12, the reference cell plate line RCP and the cell plate line CP are pulled down to "L" level, whereby data "1" is rewritten in the first ferroelectric capacitor C1 of the first normal cell 1 and the second ferroelectric capacitor C2 of the first reference cell 3.

At time t14, the second reset driver control line XRDIN3 is pulled up to "H" level so that the ninth transistor T9 is turned off, and the third reset driver control line RDIN4 is pulled up to "H" level so that the eighth transistor T8 is turned on, whereby discharge of the node ST2 is started. In the meantime, the sense amplifier activation signal SAE is pulled down to "L" level, and simultaneously, the word line WL is pulled down to "L" level, such that the first transistor T1 and the third transistor T3 are turned off, whereby the first ferroelectric capacitor C1 and the third ferroelectric capacitor C3 are disconnected from the first bit line BL1 and the third bit line BL3, respectively.

Then, at time t15, the first reset driver control line XRDIN2 is pulled up to "H" level so that the seventh transistor T7 is turned on, and the third reset driver control line RDIN4 is pulled down to "L" level so that the eighth transistor T8 is turned off, whereby discharge of the node ST2 is continued. Further, the bit line precharge control line BP is pulled up to "H" level, whereby discharge of the first bit line BL1, the second bit line BL2, the third bit line BL3 and the fourth bit line BL4 is started.

Lastly, at time t16, after the end of the discharge of the node ST2, the reset signal line RST is pulled down to "L" level so that the ferroelectric memory is restored to the initial state, whereby one cycle of the read operation is terminated.

According to embodiment 2, the cell plate line CP and the reference cell plate line RCP are simultaneously pulled up to "H" level at time t01 and t10, and the cell plate line CP and the reference cell plate line RCP are simultaneously pulled down to "L" level at time t05 and time t12. The states of the cell plate line CP and the reference cell plate line RCP are synchronized and changed at the same timings.

With the above structure, it is not necessary to separately generate a cell plate line control signal for a normal cell and a cell plate line control signal for a reference cell. Therefore, the ferroelectric memory is readily controlled, and a control circuit is simplified. Thus, the reliability of the ferroelectric memory improves, and furthermore, the chip size of the ferroelectric memory is decreased.

Embodiment 3

Hereinafter, a ferroelectric memory of embodiment 3 of the present invention is described with reference to FIG. 4.

Figure 4:
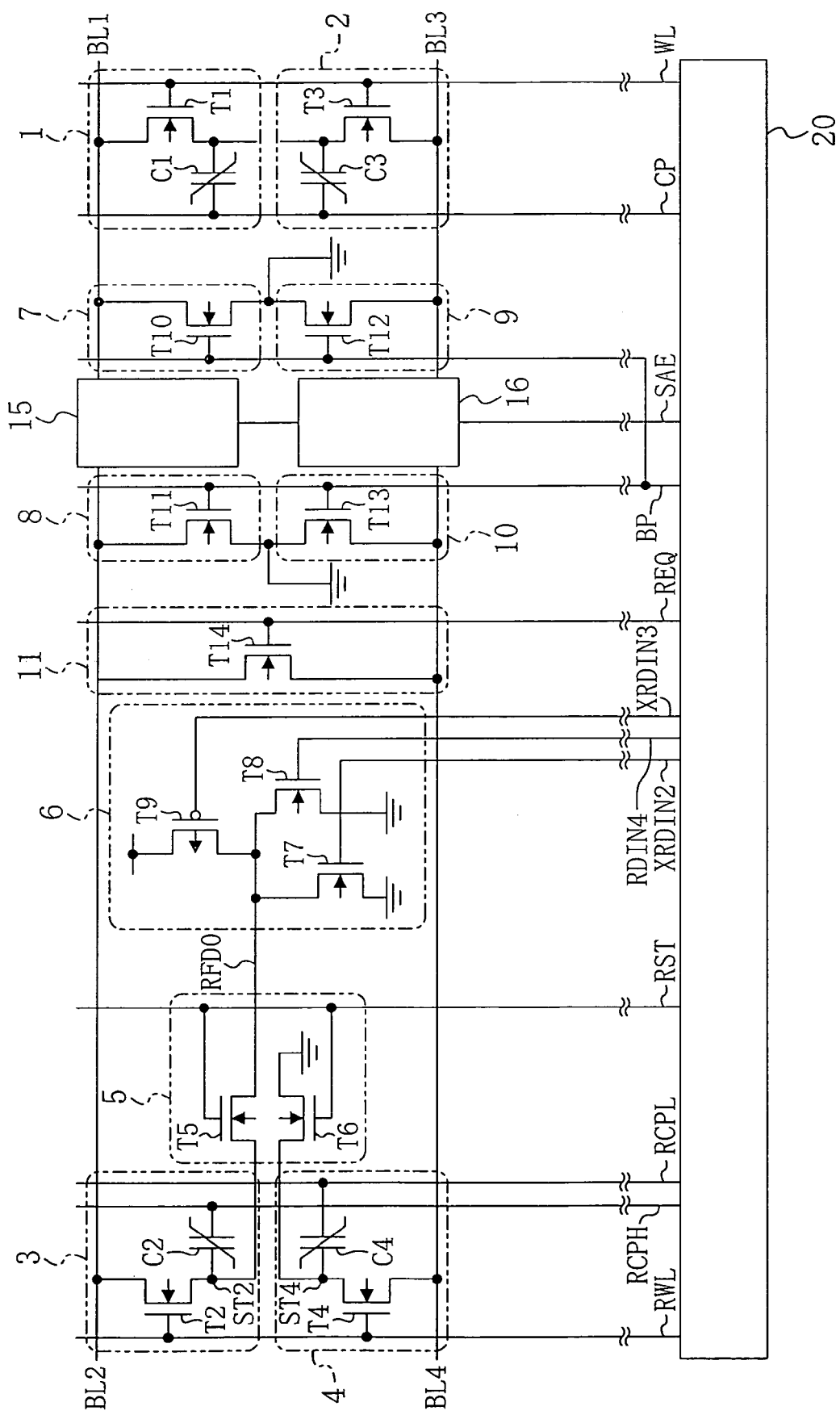
FIG. 4 is a circuit diagram showing a structure of a ferroelectric memory according to embodiment 3.
Figure 5:
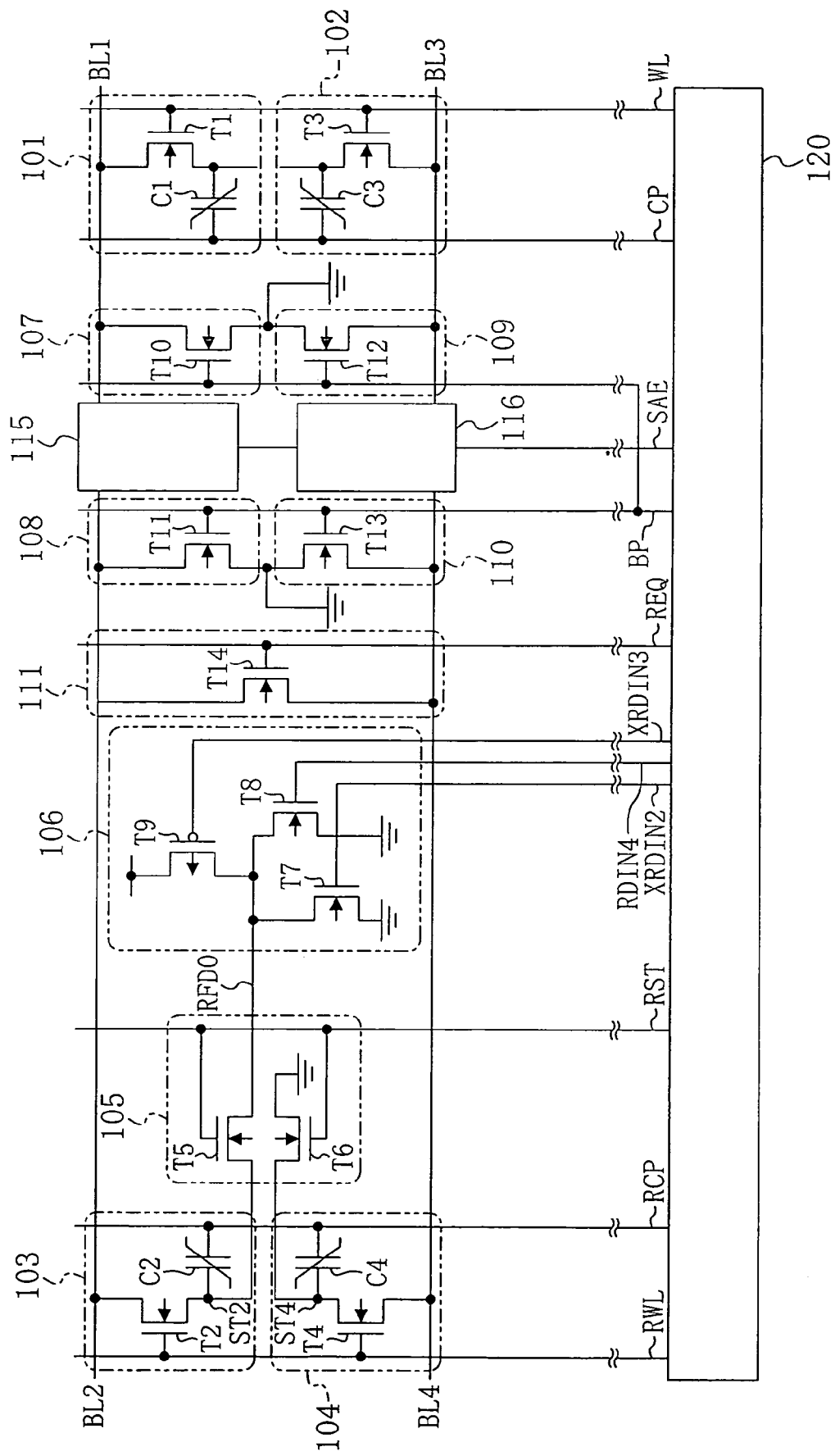
FIG. 5 is a circuit diagram showing a structure of a conventional ferroelectric memory.
Figure 6:
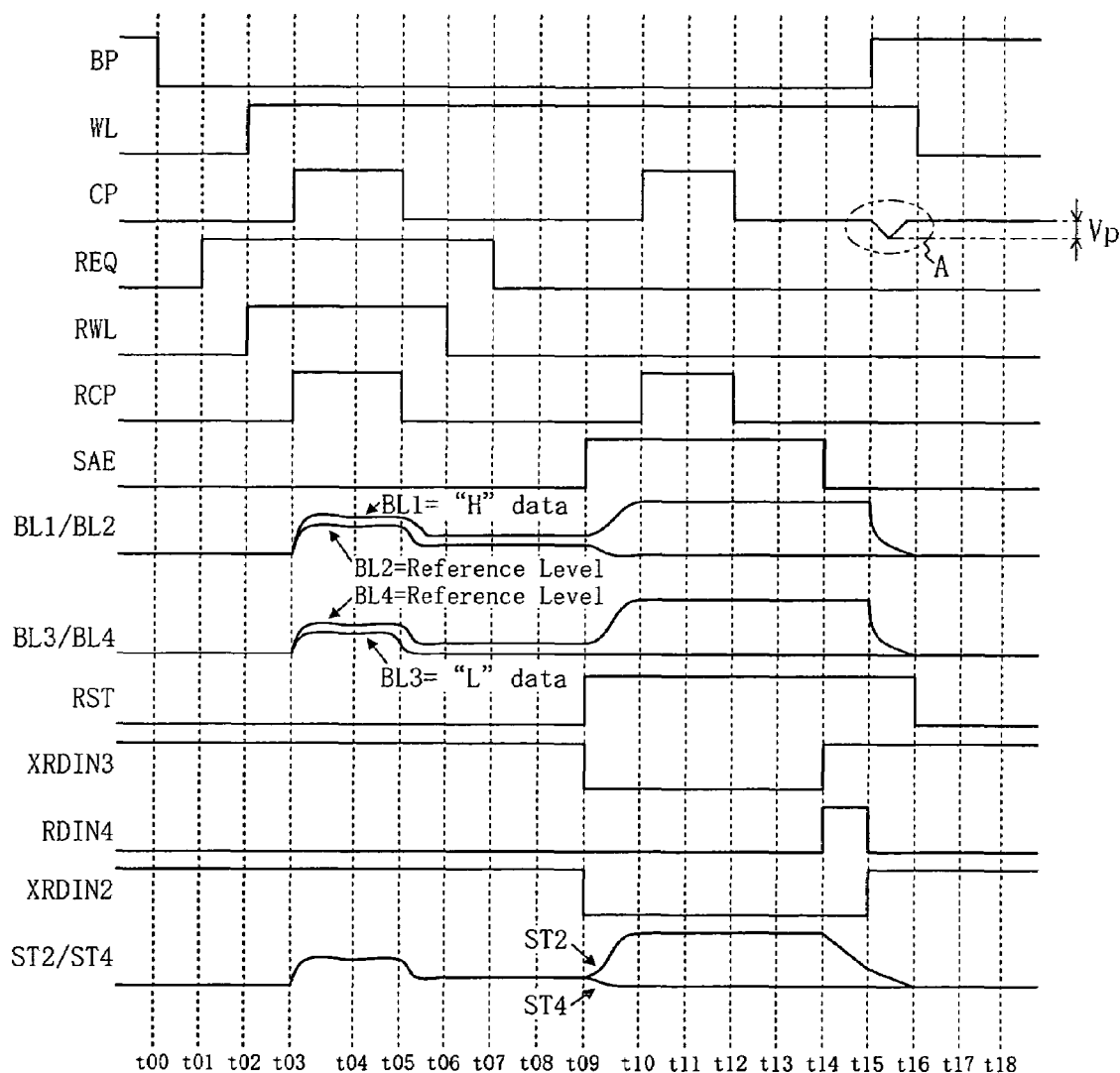
FIG. 6 is a timing chart which illustrates an operation timing of the conventional ferroelectric memory.
Figure 7:
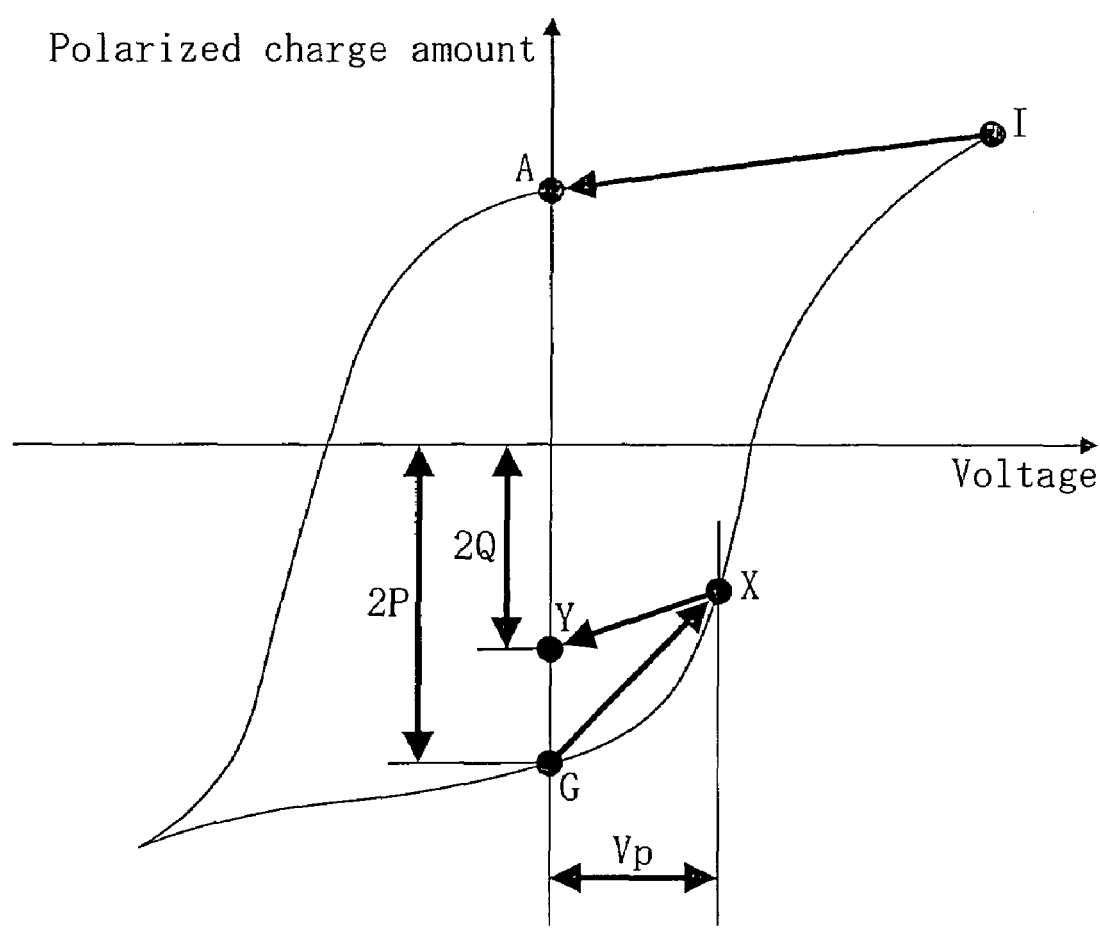
FIG. 7 is a graph which illustrates the hysteresis characteristic of a ferroelectric capacitor of the conventional ferroelectric memory.
Figure 8:
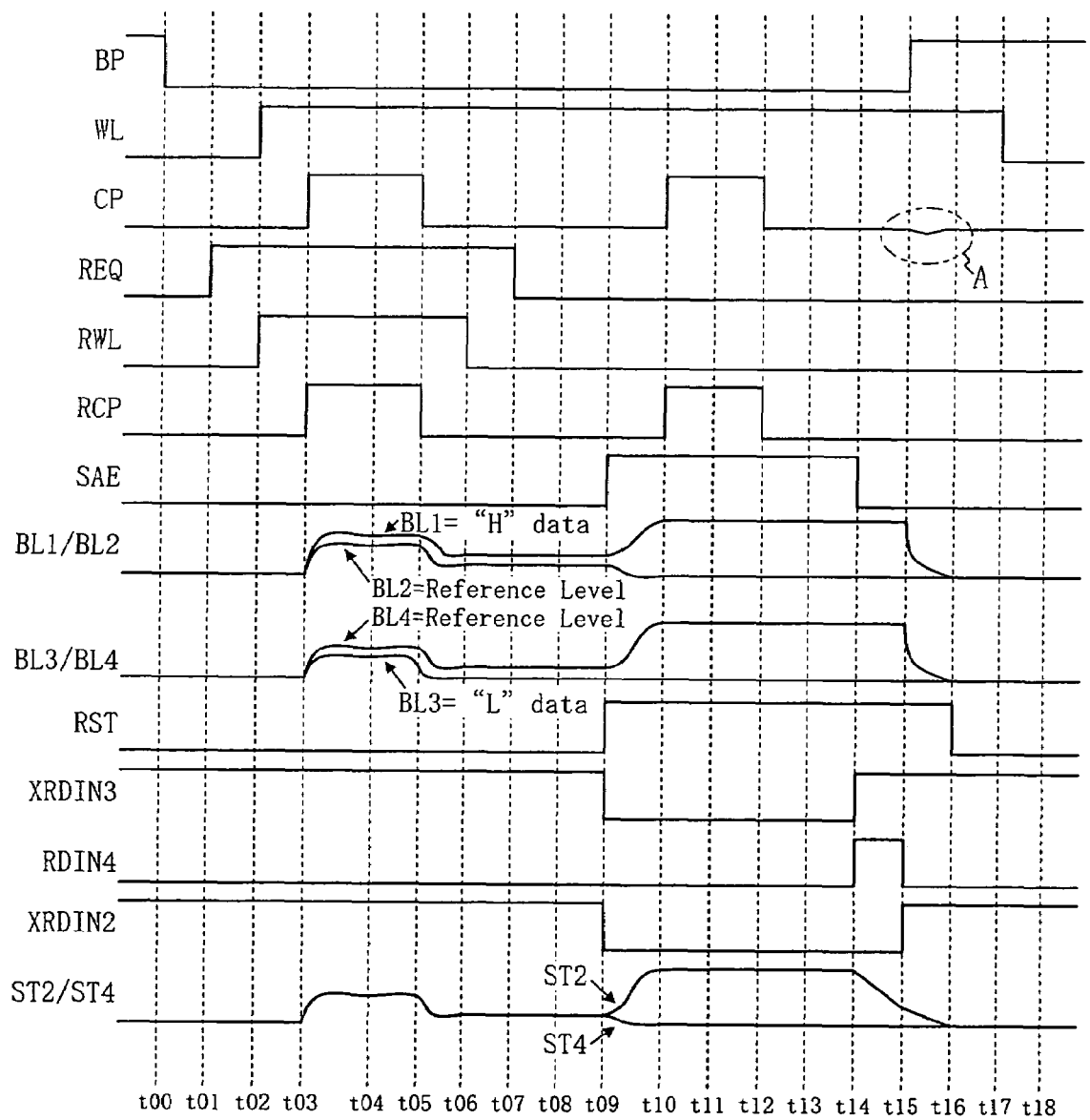
FIG. 8 is a timing chart which illustrates an operation timing of the conventional ferroelectric memory in which noise is reduced.

FIG. 4 shows a circuit structure of a ferroelectric memory according to embodiment 3 of the present invention. In FIG. 4, the same elements as those shown in FIG. 1 are denoted by the same reference numerals, and the descriptions thereof are herein omitted.

As shown in FIG. 4, in the ferroelectric memory of embodiment 3, the second electrode of the second ferroelectric capacitor C2 in the first reference cell 3 which holds data "1" is connected to a first reference cell plate line RCPH, and the second electrode of the fourth ferroelectric capacitor C4 in the second reference cell 4 which holds data "0" is connected to a second reference cell plate line RCPL.

In the above structure, only the second electrode of the ferroelectric capacitor which holds data "1" is connected to the first reference cell plate line RCPH, and only the second electrode of the ferroelectric capacitor which holds data "0" is connected to the second reference cell plate line RCPL. Thus, even if noise is caused in the first reference cell plate line RCPH in the process of discharging the first electrode of the second ferroelectric capacitor C2 which holds data "1" (node ST2), the fourth ferroelectric capacitor C4 which holds data "0" is not affected by the noise. The polarized charge amount of the fourth ferroelectric capacitor C4 which holds data "0" does not decrease.

As described above, in the ferroelectric memory embodiment 3, noise caused in a reference cell plate line does not cause a decrease in the polarized charge amount of a ferroelectric capacitor of a reference cell which holds data "0". Therefore, a precise reference potential is obtained, and accordingly, a highly-reliable ferroelectric memory is realized. Further, the first electrode of a ferroelectric capacitor of a reference cell which holds data "1" is discharged at a high speed, and therefore, the cycle time becomes shorter. Thus, a high speed ferroelectric memory is realized.

As described above, in a ferroelectric memory and a method for reading data from the ferroelectric memory according to the present invention, corruption of data stored in a normal cell during the process of discharging a bit line is prevented, and the cycle time is shortened. Thus, a highly-reliable, high-speed ferroelectric memory is realized. Therefore, the present invention is useful for, for example, a ferroelectric memory which uses a ferroelectric capacitor for a memory cell and a method for reading data from the ferroelectric memory.

What is claimed is:

1. A ferroelectric memory, comprising:
   a plurality of normal cells, each of which includes a first ferroelectric capacitor for holding data and a first transistor connected to a first electrode of the first ferroelectric capacitor;
   a first bit line connected to the first transistor;
   a first bit line precharge circuit which is a switch circuit provided between the first bit line and a ground;
   a word line connected to a gate of the first transistor, wherein the word line is deactivated to disconnect the first ferroelectric capacitor from the first bit line before the first bit line precharge circuit is driven to discharge a potential of the first bit line;
   a plurality of reference potential generation circuits;
   a plurality of sense amplifiers, each of which is connected to the first bit line and a corresponding one of the reference potential generation circuits and amplifies the potential difference between the potential of the first bit line and a reference potential generated by the corresponding reference potential generation circuit;
   a plurality of second bit lines connected to the reference potential generation circuits;
   a second bit line precharge circuit which is a switch circuit connected to the second bit lines; and a plurality of reset circuits,
wherein the reference potential generation circuits are a plurality of reference cells connected to the sense amplifiers through the second bit lines,
each of the reference cells includes
a second ferroelectric capacitor for holding data, and
a second transistor connected to a first electrode of the second ferroelectric capacitor,
the second transistor is connected to a corresponding one of the second bit lines,
a gate of the second transistor is connected to a reference word line,
a second electrode of the second ferroelectric capacitor is connected to a reference cell plate line,
adjacent two of the reference cells are connected to a corresponding one of the reset circuits which writes different data in the adjacent two reference cells, and
the second bit lines connected to the adjacent two reference cells are connected to each other through a level equalizer circuit which is a switch circuit;
wherein the speed of discharging the potential of a first electrode of the second ferroelectric capacitor from a supply voltage to a ground voltage is slower than the speed of discharging the potential of the first bit line from the supply voltage to the ground voltage, and
wherein the operation of discharging the potential of a first electrode of the second ferroelectric capacitor from the supply voltage to the ground voltage is started prior to the operation of discharging the potential of the first bit line from the supply voltage to the ground voltage.

* * * * *